US009653334B2

(12) United States Patent
Matsubara et al.

(10) Patent No.: US 9,653,334 B2
(45) Date of Patent: May 16, 2017

(54) PLASMA PROCESSING APPARATUS AND METHOD (71) Applicant: Panasonic Intellectual Property Management Co., Ltd., Osaka (JP)

(72) Inventors: Noriyuki Matsubara, Osaka (JP); Atsushi Harikai, Osaka (JP); Mitsuru Hiroshima, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/716,000

(22) Filed: May 19, 2015

(65) Prior Publication Data
US 2015/0340203 A1 Nov. 26, 2015

(30) Foreign Application Priority Data

May 26, 2014 (JP) .................. 2014-108204

(51) Int. Cl.
| | |
|---|---|
| H01L 21/683 | (2006.01) |
| H01J 37/32 | (2006.01) |
| C23C 16/455 | (2006.01) |
| C23C 16/458 | (2006.01) |
| H01L 21/3065 | (2006.01) |
| H01L 21/67 | (2006.01) |
| C23C 16/505 | (2006.01) |

(52) U.S. Cl.
CPC ........ *H01L 21/6833* (2013.01); *C23C 16/455* (2013.01); *C23C 16/458* (2013.01); *C23C 16/505* (2013.01); *H01J 37/321* (2013.01); *H01J 37/3244* (2013.01); *H01J 37/32651* (2013.01); *H01J 37/32697* (2013.01); *H01J 37/32715* (2013.01); *H01J 37/32733* (2013.01); *H01L 21/3065* (2013.01); *H01L 21/67069* (2013.01); *H01L 21/67109* (2013.01); *H01L 21/6831* (2013.01)

(58) Field of Classification Search
None
See application file for complete search history.

(56) References Cited

U.S. PATENT DOCUMENTS

2009/0040682 A1* 2/2009 Park .................... H01L 21/6831
361/234
2010/0216313 A1 8/2010 Iwai
(Continued)

FOREIGN PATENT DOCUMENTS

| JP | 4858395 B2 | 11/2011 | |
|---|---|---|---|
| KR | 10-2012-0138084 | * 3/2014 | ......... H01L 21/3065 |

*Primary Examiner* — Jiong-Ping Lu
(74) *Attorney, Agent, or Firm* — Pearne & Gordon, LLP (57) ABSTRACT

A plasma processing apparatus includes a processing chamber, a plasma source that generates plasma within the processing chamber, a transfer carrier that has a holding sheet and a frame, the holding sheet holding a substrate, and the frame being attached to the holding sheet so as to surround the substrate, a stage that is provided within the processing chamber and has a gas supply hole formed in a mounting area of the stage for mounting the transfer carrier thereon, an electrostatic chucking part that is provided within the stage and electrostatically attracts the transfer carrier, and a gas supply part that supplies gas through the gas supply hole of the stage to assist separation of the transfer carrier from the stage.

12 Claims, 5 Drawing Sheets

(56) References Cited

U.S. PATENT DOCUMENTS

2012/0238073 A1\* 9/2012 Johnson .............. H01L 21/3065
 438/464
2015/0262854 A1\* 9/2015 You .................... H01L 21/3065
 438/692

\* cited by examiner

PLASMA PROCESSING APPARATUS AND METHOD

CROSS REFERENCE TO RELATED APPLICATION(S)

The present disclosure relates to the subject matters contained in Japanese Patent Application No. 2014-108204 filed on May 26, 2014, which are incorporated herein by reference in its entirety.

FIELD

One or more embodiments of the present invention relate to a plasma processing apparatus and a method.

BACKGROUND

Patent literatures 1 and 2 mentioned below disclose examples of plasma processing apparatuses. Each of these plasma processing apparatuses carries out plasma processing such as plasma dicing and plasma asking on a substrate in a state of holing the substrate on a transfer carrier constituted of an annular frame and a holding sheet. At the time of the plasma processing, both the annular frame and the holding sheet are covered by a cover so that each of the annular frame and the holding sheet is not exposed to plasma. Further, at the time of the plasma processing, the transfer carrier holding the substrate is electrostatically attracted and adhered to a stage having being cooled, whereby the transfer carrier is cooled. Then, when the plasma processing terminates, the electrostatic attraction is cancelled and destaticizing processing is stated. In the destaticizing processing, destaticizing gas is introduced into a processing chamber and discharging is performed in a state that the electrostatic attraction is cancelled. Thus, electric charges generated by the discharging is irradiated on a surface of the subject and a surface of the transfer carrier, thereby eliminating (destaticizing) electric charges accumulated in the subject and the transfer carrier during the plasma processing and remaining in the subject and the transfer carrier after the plasma processing. By the destaticizing processing, a residual attraction force for attracting the transfer carrier to the stage is reduced and hence the transfer carrier can be separated from the stage easily.

Patent Literature 1 is Japanese Patent No. 4858395, and Patent Literature 2 is U.S. Patent Publication No. 2012/0238073.

SUMMARY

However, at the time of carrying out the destaticizing processing on the transfer carrier holding the substrate, there arises a problem that the transfer carrier is thermally damaged. Such a problem will be explained in detail.

Firstly, as described above, as the electrostatic attraction is cancelled at the time of the destaticizing processing, the transfer carrier is placed in a state of being less likely cooled. When destaticizing discharge is performed in this state, the substrate and the transfer carrier are heated by the discharge.

The holding sheet constituting the transfer carrier is constituted of resin material and hence easily softened by heat. Adhesive for fixing the holding sheet to the annular frame is easily changeable in quality by heat.

Thus, when the transfer carrier is heated by the destaticizing discharge, the transfer carrier may be thermally damaged. That is, for example, the holding sheet may be extended (or deformed) and the holding sheet may be peeled off the annular frame due to deterioration of adhesiveness of the adhesive material. When the transfer carrier receives thermal damage such as the extension or peeling of the holding sheet, there may occur a malfunction such as transfer error.

One of objects of the invention is to reduce thermal damage to a transfer carrier at a time of carrying out destaticizing processing.

According to a first aspect of the invention, a plasma processing apparatus includes:

a processing chamber;

a plasma source that generates plasma within the processing chamber;

a transfer carrier that has a holding sheet and a frame, the holding sheet holding a substrate, and the frame being attached to the holding sheet so as to surround the substrate;

a stage that is provided within the processing chamber and has a gas supply hole formed in amounting area of the stage for mounting the transfer carrier thereon;

an electrostatic chucking part that is provided within the stage and electrostatically attracts the transfer carrier; and a gas supply part that supplies gas through the gas supply hole of the stage to assist separation of the transfer carrier from the stage.

According to this configuration, the transfer carrier can be placed in a state of being easily separated from the stage by the gas supplied through the gas supply holes. Thus, the transfer carrier can be unloaded quickly before the holding sheet is thermally damaged.

According to a second aspect of the invention, a plasma processing method of carrying out plasma processing on a substrate which is held by a transfer carrier constituted of an annular frame and a holding sheet, the method includes:

a first step of mounting the transfer carrier that holds a substrate, on a stage;

a second step of performing electrostatic attraction for electrostatically attracting the transfer carrier that is mounted on the stage, to the stage;

a third step of carrying out plasma processing on the substrate; and a fourth step of cancelling the electrostatic attraction of the transfer carrier and carrying out destaticizing processing for reducing a residual attraction force between the transfer carrier and the stage, wherein during the fourth step or after the forth step, gas is supplied from a gas supply hole disposed in the stage to assist separation of the transfer carrier from the stage.

According to the embodiments, as the gas is supplied between the holding sheet and the mounting surface through the gas supply hole, the transfer carrier can be separated smoothly and quickly from the stage. Thus, after the plasma processing, the transfer carrier can be unloaded before being thermally damaged. Further, an amount of radio-frequency power necessary for the destaticizing processing can be suppressed and a time required for the destaticizing processing can be shortened.

BRIEF DESCRIPTION OF THE DRAWINGS

A general configuration that implements the various features of the invention will be described with reference to the drawings. The drawings and the associated descriptions are provided to illustrate embodiments of the invention and should not limit the scope of the invention.

DETAILED DESCRIPTION OF THE EMBODIMENTS

Hereinafter, an embodiment according to the invention will be explained with reference to attached drawings. Incidentally, following explanation merely shows examples of the invention, and is not intended to limit the invention and the applications and usage of the invention. Further, the attached drawings are schematic and ratios of respective sizes etc. in the drawings differ from those of an actual product.

Figure 1A:
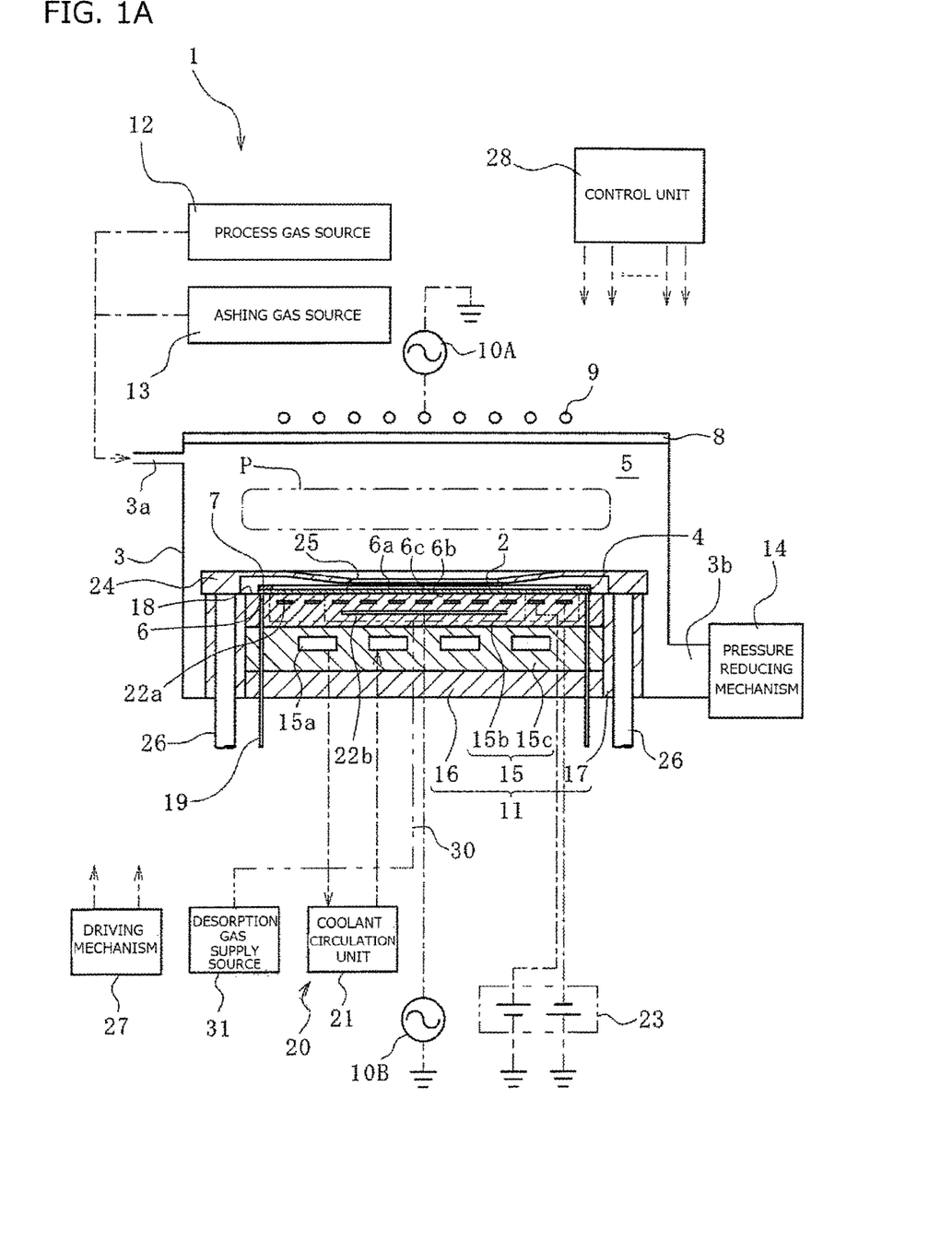
FIG. 1A is a schematic explanatory diagram showing a plasma processing apparatus according to an embodiment.
Figure 1B:
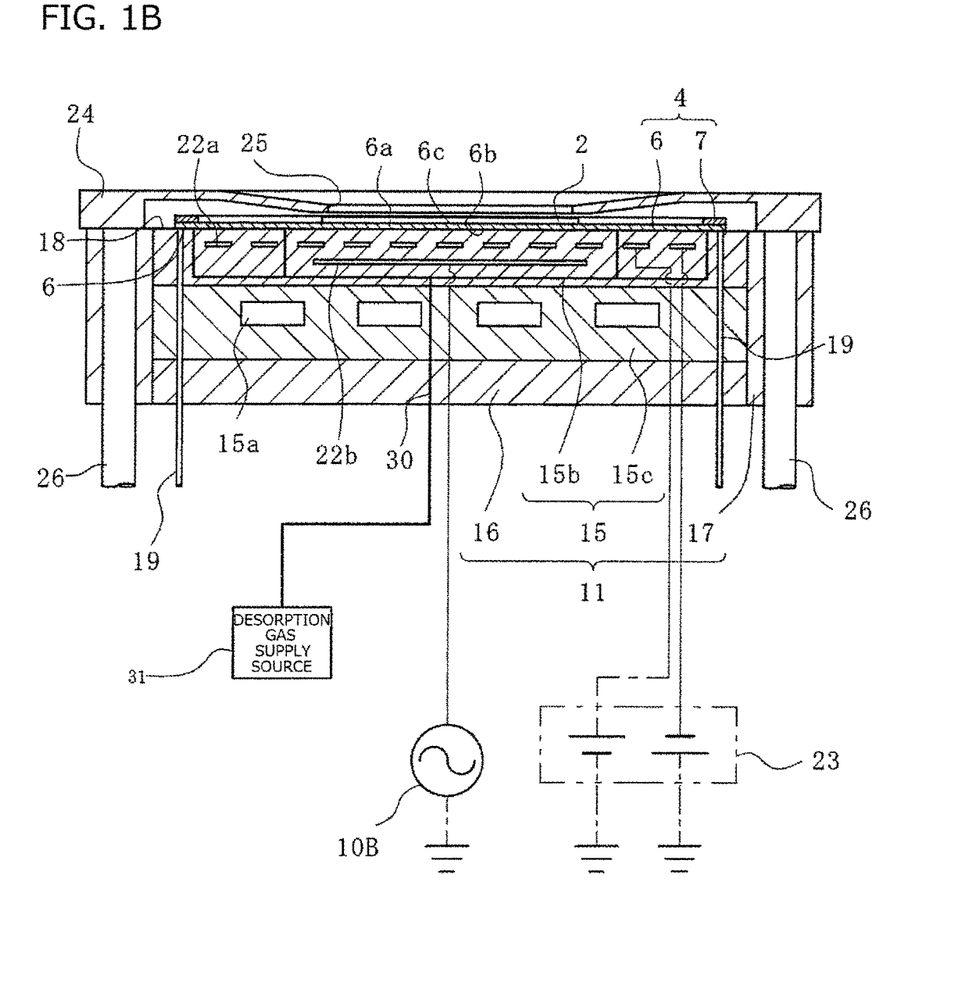
FIG. 1B is a schematic explanatory diagram mainly showing a stage of the plasma processing apparatus according to the embodiment.

FIG. 1A shows a plasma processing apparatus 1 according to an embodiment of the invention and FIG. 1B mainly shows a stage of the plasma processing apparatus. The plasma processing apparatus 1 is used for carrying out plasma processing on a wafer 2 (substrate) and includes a chamber 3. The chamber 3 has an inner space which pressure is reducible. The chamber 3 is configured so as to be able to load a transfer carrier 4 into and unload it from a processing chamber 5 as an inner space via not-shown input/output ports.

The transfer carrier 4 has a holding sheet 6 for detachably holding the wafer 2. As the holding sheet 6, for example, a so-called UV (ultraviolet) tape can be used. The UV tape is elastically extendable and holds the wafer 2 by an adhesive force thereof. However, when the UV tape receives ultraviolet rays, chemical properties of the UV tape changes and the adhesive force thereof reduces to a large extent. The holding sheet 6 is configured by one surface having adhesiveness (adhesive surface) and an opposite surface having no adhesiveness (non-adhesive surface). The holding sheet 6 is flexible and cannot keep a constant shape by itself because it bends easily. In view of this fact, a thin frame 7 (annular frame) of an almost ring shape is adhered on the adhesive surface near the outer circumferential edge of the holding sheet 6. The frame 7 is made of, for example, metal and has rigidity capable of keeping its shape.

The holding sheet 6 of the transfer carrier 4 holds the wafer 2 in a manner that a rear surface of the wafer 2 is adhered to the adhesive surface of the holding sheet. The wafer 2 is disposed at the center of a circular area surrounded by the frame 7 on the adhesive surface of the holding sheet 6. More specifically, the position of the wafer 2 is set with respect to the holding sheet 6 in a manner that the center of the circular area almost coincides with the center of the wafer 2. As the wafer 2 is disposed at the center of the circular area, a wide annular area of a constant width is formed on the holding sheet 6 between the outer circumference of the wafer 2 and the inner circumference of the frame 7.

An antenna 9 (plasma source) acting as an upper electrode is disposed above a dielectric wall 8 which closes a top part of the chamber 3 (vacuum vessel) of the plasma processing apparatus 1. The antenna 9 is electrically connected to a first radio-frequency (RF) power source 10A. A stage 11 is disposed at the bottom part side within the chamber 3. The transfer carrier 4 holding the wafer 2 as explained above is mounted on the stage 11. A process gas source 12 and an asking gas source 13 are coupled to a gas introduction port 3a of the chamber 3. A pressure reducing mechanism 14 having a vacuum pump for evacuating the chamber 3 and a pressure regulating valve for regulating a pressure within the chamber 3 is coupled to an exhaust port 3b.

The stage 11 includes an electrode part 15, a base part 16 disposed on the lower end side of the electrode part, and an exterior part 17 which surrounds the outer circumference of each of the base part and the electrode part.

The electrode part 15 is configured of an electrostatic chuck 15b and an electrode part body 15c disposed on the lower end side of the electrostatic chuck.

The electrostatic chuck 15b is constituted of dielectric material such as ceramic. The electrostatic chuck 15b contains electrostatic chucking (ESC; Electric Static Chuck) electrodes 22a of bipolar type at the upper area thereof and a radio-frequency electrode 22b at the lower area thereof. A DC power source 23 is electrically connected to the electrostatic chucking electrodes 22a. The electrostatic chucking electrodes 22a are disposed at an upper area of the electrostatic chuck 15b which corresponds to an entirety of an upper surface area of the electrode part 15 where the transfer carrier 4 is mounted. Thus, the transfer carrier 4 can be electrostatically attracted to the stage. A second radio-frequency power source 10B is electrically connected to the radio-frequency electrode 22b. An outer circumferential edge of the radio-frequency electrode 22b locates outside of the wafer 2 mounted on the transfer carrier 4 in planar view. As a result, the wafer 2 can be entirely etched by plasma having been generated.

Figure 2A:
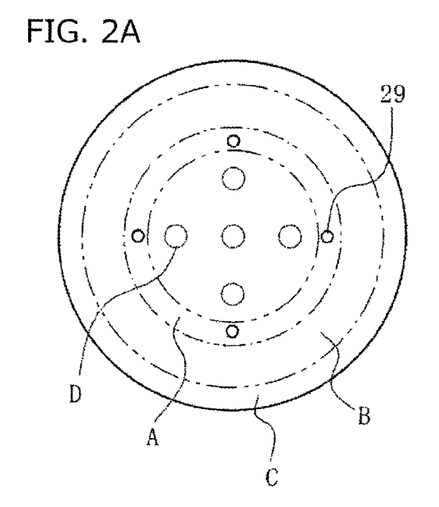
FIGS. 2A to 2D are schematic plan views of mounting surfaces of the stage shown in FIG. 1.

A plurality of gas supply holes 29 are formed at an upper surface of the electrostatic chuck 15b. In this case, the gas supply holes 29 are formed at four portions. More specifically, as shown in FIG. 2A, the gas supply holes are formed at an annular area A of the electrostatic chuck 15b which corresponds to an outer circumferential part of the wafer 2 held by the transfer carrier 4 mounted on the electrostatic chuck 15b. The gas supply holes 29 are formed at the area A with a constant interval along a circumferential direction. Plasma dicing is not performed on this outer circumferential part of the wafer 2. Each of the gas supply holes 29 communicates with a single gas introduction hole 30. Each of the gas supply holes 29 is supplied with desorption gas ($N_2$ or $O_2$, or noble gas such as Ar or He, for example) from a desorption gas supply source 31 via the gas introduction hole 30.

As described later, the desorption gas is supplied from the gas supply holes 29 after destaticizing processing which is executed after plasma processing. Thus, the transfer carrier 4 can be separated easily from a mounting surface 18 of the stage in a state that electrostatic attraction by the electrostatic chucking electrode 22a is canceled. As a result, a moving-up operation of the transfer carrier 4 by projection pins 19, described later, can be performed smoothly and quickly before the holding sheet 6 is affected by radiation heat etc. from a cover 24 and then thermally damaged.

The gas supply holes 29 can be formed at the following positions in place of or in addition to the area A shown in FIG. 2A.

Figure 2B:
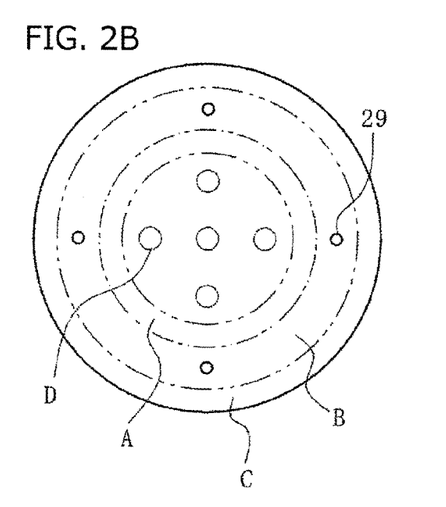

In FIG. 2B, the gas supply holes 29 are formed at an annular area B of the electrostatic chuck 15b which corresponds to an exposed area of the holding sheet 6, of the transfer carrier 4 mounted on the stage, not covered by the wafer 2 and the frame 7. The gas supply holes 29 are formed at four portions of the area B with a constant interval along the circumferential direction.

Figure 2C:
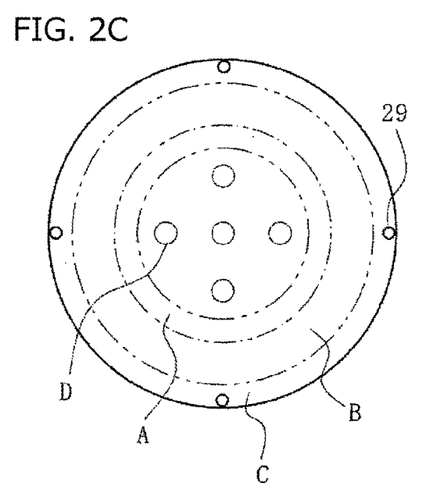

In FIG. 2C, the gas supply holes 29 are formed at an annular area C of the electrostatic chuck 15b which corresponds to an area of the holding sheet 6, of the transfer carrier 4 mounted on the stage, corresponding to the frame 7. The gas supply holes 29 are formed at four portions of the area C with a constant interval along the circumferential direction.

Figure 2D:
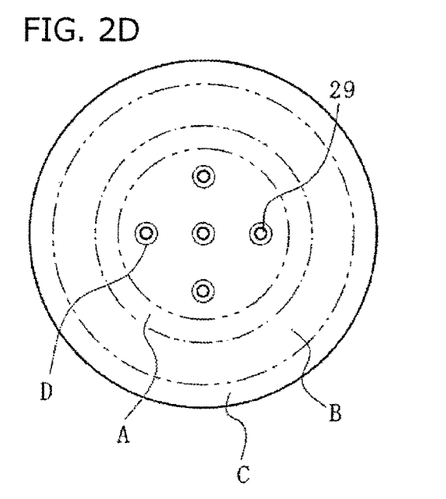

In FIG. 2D, the gas supply holes 29 are formed at respective areas D of the electrostatic chuck which correspond to areas of the holding sheet 6, of the transfer carrier 4 mounted on the stage, corresponding to non-element formation areas (test pattern) of the substrate. The gas supply holes 29 are formed at the four areas D which are arranged with a constant interval along the circumferential direction. In addition to the test pattern, the outer circumferential area of the substrate corresponding to the area A shown in FIG. 2A is included in a non-element formation area.

The number of the gas supply holes 29 is not limited to four but may be three or at least five. Further, the forming patterns of the gas supply holes 29 shown in FIG. 2A to 2D may be optionally combined.

The electrode part body 15c is constituted of metal (aluminum alloy, for example). A coolant passage 15a is formed in the electrode part body 15c.

An upper surface of the electrode part 15 and an upper surface of the exterior part 17 constitute a mounting surface 18 serving as a single horizontal plane on which the transfer carrier 4 holding the wafer 2 is mounted. A plurality of first through holes each penetrating the lower and upper surfaces of the electrode part 15 are disposed with a constant interval along the circumferential direction of the electrode part 15. A projection pin 19 is disposed within each of the first through holes so as to be movable up and down. When each of the projection pins locates at a moved-down position, the transfer carrier 4 is mounted on the upper end surface of each of the projection pins 19 in a state that the upper end surface of each of the projection pins is flush with the mounting surface 18 to constitute a common surface. When each of the projection pins locates at a moved-up position, the transfer carrier 4 is separated from the mounting surface 18 by the projection pins 19 protruded upward from the mounting surface 18.

The exterior part 17 is constituted of ground shield material (metal having conductivity and etching resistance). A plurality of second through holes each penetrating the lower and upper surfaces of the exterior part in an upper-lower direction are disposed with a constant interval along the circumferential direction of the exterior part. A driving rod 26 is disposed within each of the second through holes so as to be movable up and down. The exterior part 17 protects the electrode part 15 and the base part 16 from plasma.

The transfer carrier 4 is mounted on the stage 11 in an upward posture that the surface (adhesive surface 6a) of the holding sheet 6 holding the wafer 2 is directed upward and the non-adhesive surface 6b of the holding sheet 6 is placed on the mounting surface 18. The transfer carrier 4 is mounted on the mounting surface 18 of the stage 11, by means of a not-shown transfer mechanism, at a predetermined position and posture (including a rotation angle position around the center 6c of the circular area of the holding sheet 6) with respect to the mounting surface. Hereinafter, this predetermined position and posture is described as a normal position.

The plasma processing apparatus 1 includes a cooling unit 20 for cooling the stage 11. The cooling unit 20 includes the coolant passage 15a formed in the electrode part 15 and a coolant circulation unit 21 for circulating temperature-controlled coolant within the coolant passage 15a.

The chamber 3 contains a cover 24 movable up and down in an interior space of this chamber above the mounting surface 18 of the stage 11. The cover 24 has an outer contour of a circular shape and has a constant thin thickness. A window part 25 is formed at the center of the cover. The cover 24 covers the holding sheet 6 and the frame 7 of the transfer carrier 4 during plasma processing, thereby protecting them from plasma. To this end, the cover 24 is configured to have the outer contour larger than that of the transfer carrier 4.

The cover 24 is mounted on the driving rods 26 in a manner that a lower surface of the cover 24 contacts to the upper end surfaces of the driving rods 26. The driving rods 26 are driven so as to move up and down by a driving mechanism 27 conceptually shown only in FIG. 1A. The cover 24 is moved up and down in accordance with the up-down movement of the driving rods 26. More specifically, the cover 24 can be positioned at a lowered position where the cover 24 is mounted on the mounting surface 18 of the stage 11, a first raised position above the lowered position, and a second raised position (highest position) above the first raised position. The cover 24 at the lowered position locates at a position, with respect to the holding sheet 6 of the transfer carrier 4 mounted on the mounting surface 18 of the stage 11, that the cover 24 protects the holding sheet 6 and the frame 7 from plasma during plasma processing but is not made contact therewith. As the cover 24 at the lowered position is not made contact with the holding sheet 6, heat of the cover 24 heated by plasma processing can be prevented from being directly transmitted to the holding sheet 6. Further, the adhesive surface of the holding sheet 6 can be prevented from contacting and adhering to the cover 24.

A control unit 28 schematically shown only in FIG. 1A controls operations of respective constituent elements of the plasma processing apparatus 1 including the first and second radio-frequency power sources 10A and 10B, the process gas source 12, the asking gas source 13, the pressure reducing mechanism 14, the cooling unit 20, the DC power source 23 and the driving mechanism 27.

Next, operations of the plasma processing apparatus 1 according to the embodiment will be explained with reference to FIGS. 3A to 4.

Figure 3A:
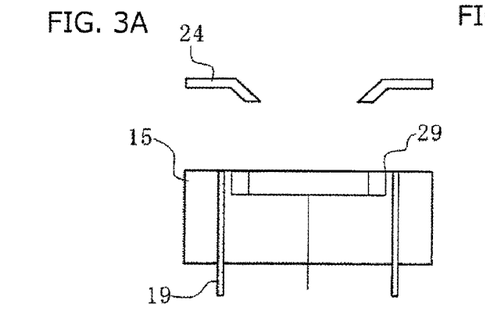
FIGS. 3A to 3G are explanatory diagrams showing plasma processing according to the embodiment.
Figure 3B:
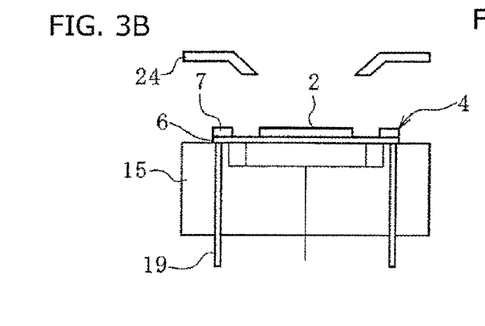
Figure 4:
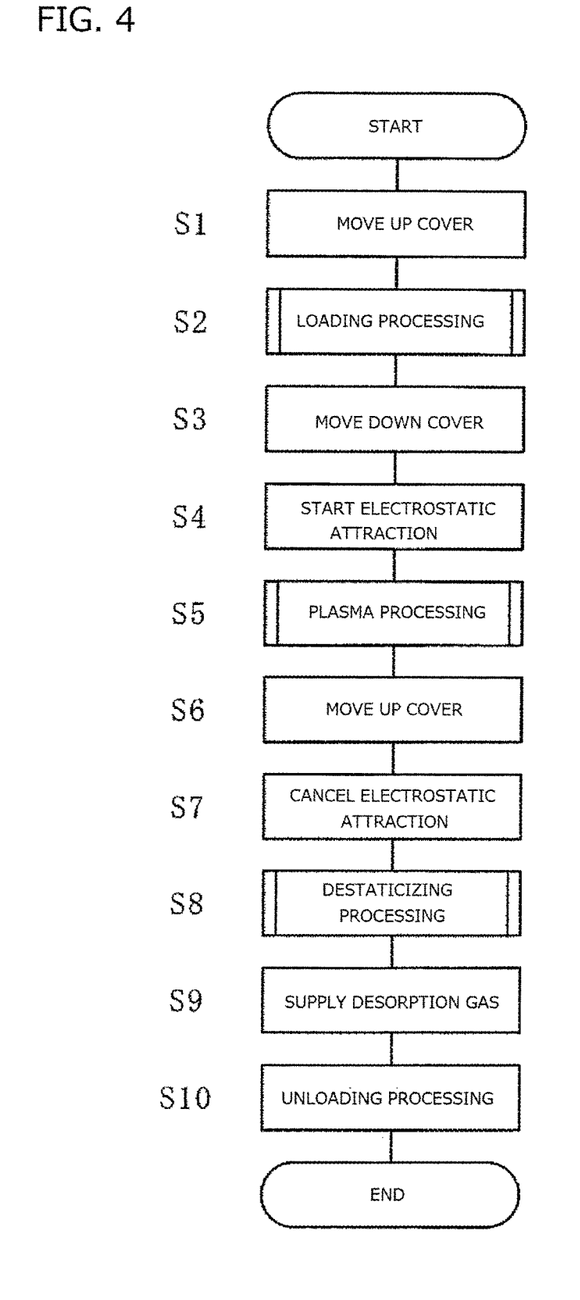
FIG. 4 is a flowchart showing the plasma processing according to the embodiment.

As shown in FIG. 3A, the cover 24 is moved up to the second raised position (step S1). Then, as shown in FIG. 3B, the transfer carrier 4, adhering the wafer 2 to the center 6c of the circular area of the holding sheet 6, is loaded into the chamber 3 by means of the not-shown transfer mechanism and mounted on the normal position of the mounting surface 18 of the stage 11 (step S2: loading processing (first step)).

Figure 3C:
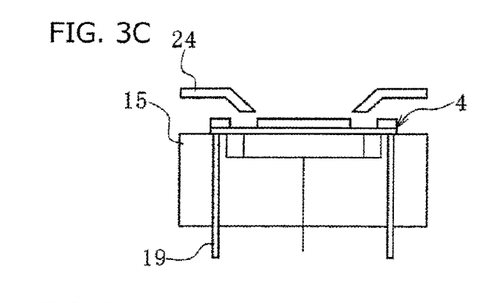

Then, as shown in FIG. 3C, the driving rods 26 are driven by the driving mechanism 27 to move the cover 24 down to the lowered position from the second raised position (step S3). When the cover 24 reaches the lowered position, the cover 24 covers the holding sheet 6 and the frame 7 of the transfer carrier 4 and exposes the wafer 2 from the window part 25 of the cover 24. At this lowered position, the cover 24 does not contact the holding sheet 6 or the frame 7.

Then, the DC power source 23 supplies DC voltage to the electrostatic chucking electrodes 22a, whereby the transfer carrier 4 is electrostatically attracted and held on the mounting surface 18 (upper end surface of the electrode part 15) of the stage 11 (step S4: second step). In this state, temperature of the stage 11 is adjusted to a range from 15 to 20

C.°, whilst temperature of the transfer carrier 4 is kept at almost 20 C.° because the transfer carrier is adhered to the mounting surface 18 of the stage 11.

Figure 3D:
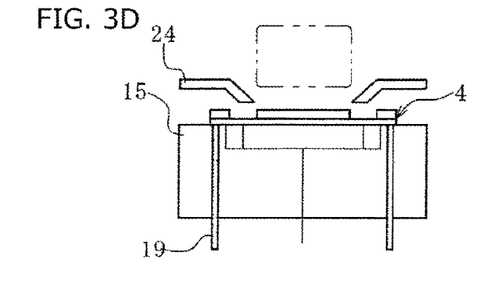

Then, as shown in FIG. 3D, following respective plasma processing (step S5: plasma dicing and plasma asking (third step)) are executed.

In the plasma dicing, process gas (SF6, for example) is introduced into the chamber 3 from the process gas source 12 while the process gas is exhausted by the pressure reducing mechanism 14, whereby a pressure within the processing chamber 5 is kept to a predetermined value (10 Pa, for example). Thereafter, the radio-frequency power source 10A supplies radio-frequency power (2,000 W, for example) to the antenna 9 to generate plasma P within the chamber 3. Plasma thus generated is irradiated to the wafer 2 exposed from the window part 25 of the cover 24. In this case, the radio-frequency power source 10B applies bias voltage (50 W, for example) to the electrode part 15 of the stage 11. Further, the cooling unit 20 cools the stage 11 (20 C.°, for example). A resist mask for defining a chip area is already formed on the surface of the wafer 2 at a preceding process. When the plasma processing is carried out on the wafer 2 having the resist mask, the wafer 2 is etched away at portions (streets) not protected by the resist mask on the surface of the wafer 2, due to physicochemical action between ions and radicals in the plasma P. The etching process is continued to the rear surface of the wafer 2, whereby the wafer 2 is divided into respective chips.

In the plasma ashing, ashing process gas (oxygen gas, for example) is introduced into this chamber from the ashing gas source 13 while the ashing process gas is exhausted by the pressure reducing mechanism 14, whereby a pressure within the processing chamber 5 is kept to a predetermined value (10 Pa, for example). Thereafter, the radio-frequency power source 10A supplies radio-frequency power (2,000 W, for example) to the antenna 9 to generate oxygen plasma P within the chamber 3. Oxygen plasma thus generated is irradiated to the wafer 2 exposed from the window part 25 of the cover 24. The resist mask is completely removed from the surface of the wafer 2 by the irradiation of the oxygen plasma P.

In the plasma processing, as the transfer carrier 4 is attracted to the mounting surface 18 of the stage 11 by electrostatic attraction, the transfer carrier is effectively cooled by the cooling unit 20 provided at the stage 11. In this state, although temperature of the cover 24 increases to about 230 C.°, temperature of the transfer carrier 4 is adjusted to a range from 30 to 40 C.° because the transfer carrier is kept to be electrostatically attracted to the stage 11 as described above.

Figure 3E:
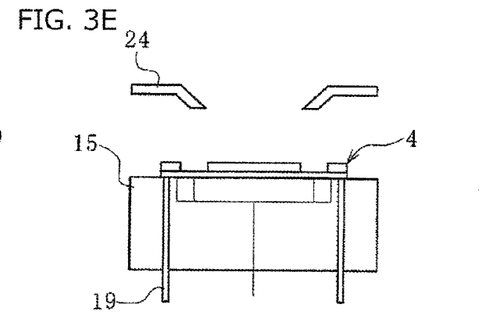

When the plasma processing terminates, as shown in FIG. 3E, the driving rods 26 are driven by the driving mechanism 27 to move the cover 24 up to the first raised position from the lowered position (step S6). Thus, an amount of radiation heat irradiated to the holding sheet 6 of the transfer carrier 4 from the cover 24 heated in the plasma processing etc. is reduced.

Next, application of the DC voltage to the electrostatic chucking electrodes 22a from the DC power source 23 is stopped, whereby the electrostatic attraction is cancelled (step S7). In this state, due to residual attraction caused by residual charges remained in the wafer 2 having been charged during the plasma processing, the transfer carrier 4 may not be moved up suitably by merely moving the projection pins 19 up.

Figure 3F:
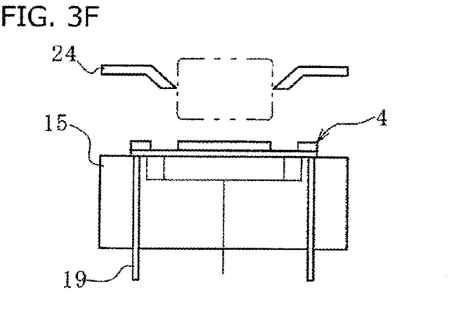

In view of this, as shown in FIG. 3F, destaticizing gas is introduced into the chamber 3 from the process gas source 12 and destaticizing processing is executed (step S8: destaticizing processing (fourth step)). Inert gas such as He or Ar can be used as the destaticizing gas. The radio-frequency power source 10A supplies radio-frequency power (about 100 W in this case) to the antenna 9 to perform discharge. In this case, the destaticizing gas is exhausted by the pressure reducing mechanism 14 to keep pressure within the processing chamber 5 to a predetermined value. The residual charges of the wafer 2 and the transfer carrier 4 are eliminated by the destaticizing gas thus introduced.

After termination of the destaticizing processing, the desorption gas is supplied between the mounting surface 18 and the holding sheet 6 from the gas supply holes 29 (step S9). In this case, for example, argon gas at a flow rate of almost 50 sccm may be supplied from the gas supply holes 29. Thus, the contact state of the holding sheet 6 to the mounting surface 18 can be relieved forcedly.

Figure 3G:
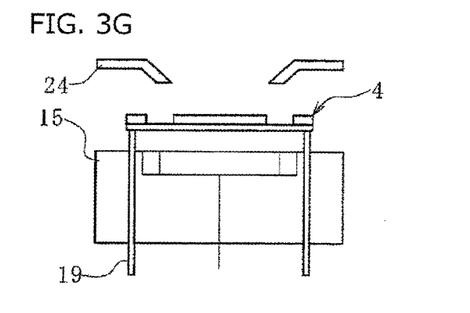

Thereafter, supply of the desorption gas from the gas supply holes 29 is stopped. Then, as shown in FIG. 3G, the projection pins 19 are moved up to an upper position from a lower position to thereby push the transfer carrier 4 up. As the transfer carrier 4 is already destaticized and the contact state between the holding sheet 6 and the mounting surface 18 is relieved by the desorption gas, the push-up operation can be performed smoothly and quickly. The transfer carrier 4 thus pushed up is unloaded from the chamber 3 by the not-shown transfer mechanism (step S10: unloading processing).

In this manner, the contact state between the holding sheet 6 and the mounting surface 18 is forcedly relieved by supplying the desorption gas between the holding sheet 6 and the mounting surface 18 after the destaticizing processing. As described above, at the time of the destaticizing processing, as the electrostatic attraction using the electrostatic chucking electrode 22a is cancelled, the transfer carrier 4 is placed in a state of not being cooled sufficiently by the stage 11. Thus, each of the wafer 2 and the transfer carrier 4 is heated by destaticizing discharge, and hence the transfer carrier may be thermally damaged. However, according to the embodiment, in addition to the destaticizing processing, separation of the transfer carrier 4 from the stage 11 is assisted by supplying the desorption gas. Thus, it becomes possible to reduce an amount of the radio-frequency power supplied at the time of the destaticizing discharge of the destaticizing processing or (and) shorten the processing time of the destaticizing discharge. By doing so, thermal damage to the transfer carrier due to the destaticizing discharge can be reduced. For example, in the case of separating the transfer carrier from the stage only by the destaticizing processing without supplying the desorption gas, it is necessary to supply the radio-frequency power of 200 W to the antenna 9 and to perform discharge for about 60 seconds, as a condition of the destaticizing processing. As a result, temperature of the transfer carrier increases to a value exceeding 100 C.°, and hence the transfer carrier is thermally damaged. In contrast, when supply of the desorption gas is performed, the transfer carrier can be detached from the stage even when the destaticizing processing is carried out under a low-power and short-time condition that the radio-frequency power of 100 W is supplied to perform discharge for about 10 seconds. Thus, temperature of the transfer carrier is suppressed to 100 C.° or less, and hence thermal damage can be prevented.

The invention is not limited to the configuration described in the embodiment but may be modified in various manners.

For example, in the embodiment, although the projection pins 19 are moved up after supply of the desorption gas is stopped, the projection pins 19 may be moved up while supply of the desorption gas is continued.

Further, in the embodiment, although the desorption gas is supplied between the holding sheet 6 and the mounting surface 18 after termination of the destaticizing processing, the desorption gas may be supplied during the destaticizing processing. In this case, supply of the desorption gas may be continued until the moving-up of the transfer carrier 4 by the projection pins 19 is started.

Further, in the embodiment, although the transfer carrier 4 is moved up by the projection pins 19 after termination of the destaticizing processing, the transfer carrier may be moved up during the destaticizing processing. In this case, also like the aforesaid case, supply of the desorption gas may be continued until the moving-up of the transfer carrier 4 by the projection pins 19 is started.

Further, in the embodiment, although the projection pins 19 are moved up and down between the upper position and the lower position, each of the projection pins may be configured to be able to stop at a slightly protruding position between the upper position and the lower position. In this case, the destaticizing processing may be divided into three stages (destaticization 1, destaticization 2, destaticization 3) chronologically. The position of each of the projection pins 19 may be changed with a lapse of time from the lower position (destaticization 1) through the slightly protruding position (destaticization 2) to the upper position (destaticization 3). In this case, supply of the desorption gas may be started at optional one of these stages from the destaticization 1 to the destaticization 3.

Further, in the embodiment, although the cover 24 is moved up to the raised position before the destaticizing processing, the cover 24 may be moved up to the raised position after the destaticizing processing.

Further, in the embodiment, although the desorption gas is set to be ejected at the same pressure from each of the gas supply holes 29, the ejection gas pressure may differ depending on the location of each of the gas supply holes 29. For example, the gas supply holes 29 may be formed in at least one of the areas A, B and D in addition to the area C corresponding to the frame 7, and the ejection gas pressure of the area C may be set to be larger than that of the at least one of the areas A, B and D, preferably.

The electrostatic chucking electrode is not limited to the bipolar type according to the embodiment but may be a unipolar type.

Further, processing executed in the plasma processing apparatus 1 is not limited to the plasma dicing and the plasma ashing, but may be normal dry etching, for example. Furthermore, the plasma processing apparatus 1 is not limited to an ICP (Inductively Coupled Plasma) type according to the embodiment, but may be a parallel plate type. The invention can also be applied to other plasma processing apparatuses such as a plasma CVD (Chemical Vapor Deposition) apparatus.

What is claimed is:

1. A plasma processing method of carrying out plasma processing on a substrate which is held by a transfer carrier constituted of an annular frame and a holding sheet, the method comprising:
   a first step of mounting the transfer carrier that holds the substrate, on a stage;
   a second step of performing electrostatic attraction for electrostatically attracting the transfer carrier that is mounted on the stage, to the stage;
   a third step of carrying out plasma processing on the substrate; and
   a fourth step of cancelling the electrostatic attraction of the transfer carrier and carrying out destaticizing processing by electrically discharging in a destaticizing gas for reducing a residual attraction force between the transfer carrier and the stage, wherein
   during the fourth step or after the fourth step, a desorption gas is supplied from a gas supply hole disposed in the stage to assist separation of the transfer carrier from the stage by pushing up the transfer carrier with a projection pin, and
   wherein in the fourth step, the electrical discharging in the destaticizing gas is performed by supplying radio-frequency power to an antenna, the antenna being provided as an upper electrode of a processing chamber.

2. The plasma processing method according to claim 1, wherein
   the gas supply hole is formed at a portion of a mounting area which corresponds to an exposed area of the holding sheet, of the transfer carrier mounted on the stage, not covered by the substrate and the frame.

3. The plasma processing method according to claim 1, wherein
   the gas supply hole is formed at a portion of a mounting area which corresponds to an area of the holding sheet, of the transfer carrier mounted on the stage, corresponding to the frame.

4. The plasma processing method according to claim 1, wherein
   the gas supply hole is formed at a portion of a mounting area which corresponds to an area of the holding sheet, of the transfer carrier mounted on the stage, corresponding to a non-element formation area of the substrate.

5. The plasma processing method according to claim 4, wherein
   the non-element formation area of the substrate is an outer circumferential area of the substrate.

6. The plasma processing method according to claim 4, wherein
   the non-element formation area of the substrate is a test pattern formed on the substrate.

7. The plasma processing method according to claim 1, wherein
   the stage is cooled by a coolant during the third step.

8. The plasma processing method according to claim 1, wherein in the fourth step, the destaticizing gas is introduced into the processing chamber in which the substrate is located on the stage and the destaticizing gas is exhausted by a pressure reducing mechanism to keep pressure within the processing chamber to a predetermined value after the destaticizing gas is filled in the processing chamber and before the desorption gas is supplied.

9. The plasma processing method according to claim 1, wherein in the fourth step, the antenna electrically discharges in the destaticizing gas, the antenna being provided as the upper electrode above a dielectric wall which closes a top part of the processing chamber.

10. A plasma processing method of carrying out plasma processing on a substrate which is held by a transfer carrier constituted of an annular frame and a holding sheet, the method comprising:
    a first step of mounting the transfer carrier that holds the substrate, on a stage;
    a second step of performing electrostatic attraction for electrostatically attracting the transfer carrier that is mounted on the stage, to the stage;

a third step of carrying out plasma processing on the substrate to singulate the substrate into plurality of dies on the holding sheet; and a fourth step of cancelling the electrostatic attraction of the transfer carrier and carrying out destaticizing processing by electrically discharging in a destaticizing gas for reducing a residual attraction force between the transfer carrier and the stage, wherein during the fourth step or after the fourth step, gas is supplied from a gas supply hole disposed in the stage to assist separation of the transfer carrier from the stage by pushing up the transfer carrier with a projection pin, and wherein in the fourth step, the electrical discharging in the destaticizing gas is performed by supplying radio-frequency power to an antenna, the antenna being provided as an upper electrode of a processing chamber.

11. The plasma processing method according to claim 10, wherein in the fourth step, the destaticizing gas is introduced into the processing chamber in which the substrate is located on the stage and the destaticizing gas is exhausted by a pressure reducing mechanism to keep pressure within the processing chamber to a predetermined value after the destaticizing gas is filled in the processing chamber and before the desorption gas is supplied.

12. The plasma processing method according to claim 10, wherein in the fourth step, the antenna electrically discharges in the destaticizing gas, the antenna being provided as the upper electrode above a dielectric wall which closes a top part of the processing chamber.

* * * * *